(12) United States Patent
Cho

(10) Patent No.: US 9,153,579 B2
(45) Date of Patent: Oct. 6, 2015

(54) SEMICONDUCTOR DEVICE HAVING EXTENDED BURIED GATE

(71) Applicant: SK HYNIX INC., Icheon (KR)

(72) Inventor: Young Man Cho, Icheon (KR)

(73) Assignee: SK Hynix Inc., Icheon (KR)

(*) Notice: Subject to any disclaimer, the term of this patent is extended or adjusted under 35 U.S.C. 154(b) by 0 days.

(21) Appl. No.: 13/937,116

(22) Filed: Jul. 8, 2013

(65) Prior Publication Data
US 2014/0010007 A1    Jan. 9, 2014

(30) Foreign Application Priority Data

Jul. 9, 2012  (KR) .................. 10-2012-0074576
Jun. 25, 2013  (KR) .................. 10-2013-0073249

(51) Int. Cl.
| | | |
|---|---|---|
| H01L 29/94 | (2006.01) |
| H01L 27/088 | (2006.01) |
| G11C 11/40 | (2006.01) |
| H01L 29/423 | (2006.01) |
| H01L 27/108 | (2006.01) |

(52) U.S. Cl.
CPC ............. *H01L 27/088* (2013.01); *G11C 11/40* (2013.01); *H01L 27/10876* (2013.01); *H01L 27/10891* (2013.01); *H01L 29/4236* (2013.01); *H01L 29/42356* (2013.01)

(58) Field of Classification Search
CPC ............... H01L 29/42356; H01L 19/4236; H01L 27/10876
USPC ............ 257/330–332, 334, E29.13, E29.134, 257/E29.135, E29.264
See application file for complete search history.

(56) References Cited

U.S. PATENT DOCUMENTS

| | | | |
|---|---|---|---|
| 2007/0170499 A1* | 7/2007 | Araki .......................... 257/330 |
| 2008/0153277 A1 | 6/2008 | Jung | |
| 2011/0156135 A1* | 6/2011 | Yoon et al. ................... 257/330 |
| 2012/0175701 A1 | 7/2012 | Park | |
| 2013/0020622 A1* | 1/2013 | Saino ........................... 257/296 |

FOREIGN PATENT DOCUMENTS

| | | |
|---|---|---|
| KR | 10-2008-0059019 A | 6/2008 |
| KR | 10-2012-0080486 A | 7/2012 |

\* cited by examiner

*Primary Examiner* — Matthew E Warren

(57) ABSTRACT

An electronic device includes a device isolation film formed to define an active region in a substrate, a first gate buried to traverse the active region and the device isolation film in a first direction, and a second gate coupled to the first gate buried in the device isolation film, and extended in a second direction.

20 Claims, 10 Drawing Sheets

SEMICONDUCTOR DEVICE HAVING EXTENDED BURIED GATE

CROSS-REFERENCE TO RELATED APPLICATION

The priority of Korean patent application No. 10-2012-0074576 filed on 9 Jul. 2012 and No. 10-2013-0073249 filed on 25 Jun. 2013, the disclosure of which is hereby incorporated by reference in its entirety, is claimed.

BACKGROUND

With the increasing development of semiconductor industries, highly-integrated electronic appliances and high-performance electronic appliances need to be developed, such that electronic devices serving as the core components of the electronic appliances also need to be highly integrated with high-level performances. However, as an integration degree of the electronic devices increases and a unit cell size of a transistor included in the electronic devices is reduced, electrical characteristics of the electronic devices are unavoidably deteriorated. As a result, a transistor including a buried word line has recently been proposed and developed.

SUMMARY

Various embodiments are directed to providing an electronic device and a method for forming the same to address the issues of the related art.

An embodiment relates to an electronic device and a method for forming the same in which a width of an active region is increased to facilitate patterning. A width of the word line in a device isolation region is extended, such that resistance of the word line is reduced. Thus, a word-line drive current increases, and a channel width of the active region increases. Accordingly, when a DRAM cell is scaled down, a process margin and characteristics of the electronic device can be improved.

In accordance with one aspect of the embodiment, an electronic device includes: a device isolation film formed to define an active region in a substrate; a first gate buried to traverse the active region and the device isolation film in a first direction; and a second gate coupled to the first gate buried in the device isolation film, and extended in a second direction.

In accordance with another aspect of the embodiment, a method for forming an electronic device includes: forming a device isolation film configured to define an active region in a substrate; forming a first gate configured to traverse the active region and the device isolation film in a first direction; and forming a second gate, coupled to the first gate buried in the device isolation film and extending in a second direction.

The second gate may be extended to one end of the active region.

The second gate may be more extended than one end of the active region.

The second gate may be extended in one direction within the device isolation film.

An insulation film is formed over the first gate and the second gate.

A bit line is configured to cross the first gate.

A source/drain region is formed over the active region.

The active region may be in a 6F2 configuration.

A longitudinal axis of the active region may be arranged in a diagonal direction with respect to the first direction.

In accordance with another aspect of the embodiment, a processor includes: a core unit configured to perform an operation corresponding to an external input command using data; a cache memory unit configured to store at least one of data required for executing the operation, data corresponding to a result of the operation execution, and an address of the operation execution data; a bus interface coupled between the core unit and the cache memory, and configured to transmit data between the core unit and the cache memory; an embedded memory unit configured to store data; a communication module unit configured to transmit/receive data to/from an external device by wire or wirelessly; a memory controller configured to drive an external memory device; and a media processor configured to fabricate either data processed by a processor or data received from an external input device, and output the fabricated data to an external interface device, wherein the embedded memory unit includes a device isolation film configured to define an active region in a substrate, a first gate buried to traverse the active region and the device isolation film in a first direction, and a second gate coupled to the first gate buried in the device isolation film, and extended in a second direction.

In accordance with another aspect of the embodiment, a system includes: a processor configured to interpret an external input command, and control an operation of information according to a result of the command interpretation; an auxiliary memory unit configured to store a program needed for the command interpretation and the information; a main memory unit configured to shift/store the program and the information from the auxiliary memory unit in such a manner that the processor performs the operation using the program and the information during execution of the program; and an interface configured to perform communication between an external part and at least one of the processor, the auxiliary memory unit, and the main memory unit, wherein the main memory unit includes a device isolation film formed to define an active region in a substrate; a first gate buried to traverse the active region and the device isolation film in a first direction; and a second gate coupled to the first gate buried in the device isolation film, and extended in a second direction.

In accordance with another aspect of the embodiment, a data storage system includes: a storage unit configured to store data, and maintain the stored data irrespective of the presence or absence of power source; a controller configured to control data input/output (I/O) of the storage unit in response to an external input command; a temporary storage unit configured to temporarily store data exchanged between the storage unit and an external part; and an interface configured to perform communication between an external part and at least one of the storage unit, the controller, and the temporary storage unit, wherein the temporary storage unit includes a device isolation film formed to define an active region in a substrate; a first gate buried to traverse the active region and the device isolation film in a first direction; and a second gate coupled to the first gate buried in the device isolation film, and extended in a second direction.

In accordance with another aspect of the embodiment, a memory system includes: a memory configured to store data, and maintain the stored data irrespective of the presence or absence of power source; a memory controller configured to control data input/output (I/O) of the storage unit in response to an external input command; a buffer memory configured to perform buffering of data exchanged between the storage unit and an external part; and an interface configured to perform communication between an external part and at least one of the storage unit, the memory controller, and the buffer memory, wherein the buffer memory includes a device isolation film formed to define an active region in a substrate; a first gate buried to traverse the active region and the device isolation film in a first direction; and a second gate coupled to the first gate buried in the device isolation film, and extended in a second direction.

It is to be understood that the embodiments are exemplary and explanatory and are not intended to be limiting.

DESCRIPTION OF EMBODIMENTS

Reference will now be made in detail to certain embodiments, examples of which are illustrated in the accompanying drawings. Wherever possible, the same reference numbers will be used throughout the drawings to refer to the same or like parts. An electronic device and a method for forming the same according to embodiments will hereinafter be described with reference to the appended drawings.

Figure 1:
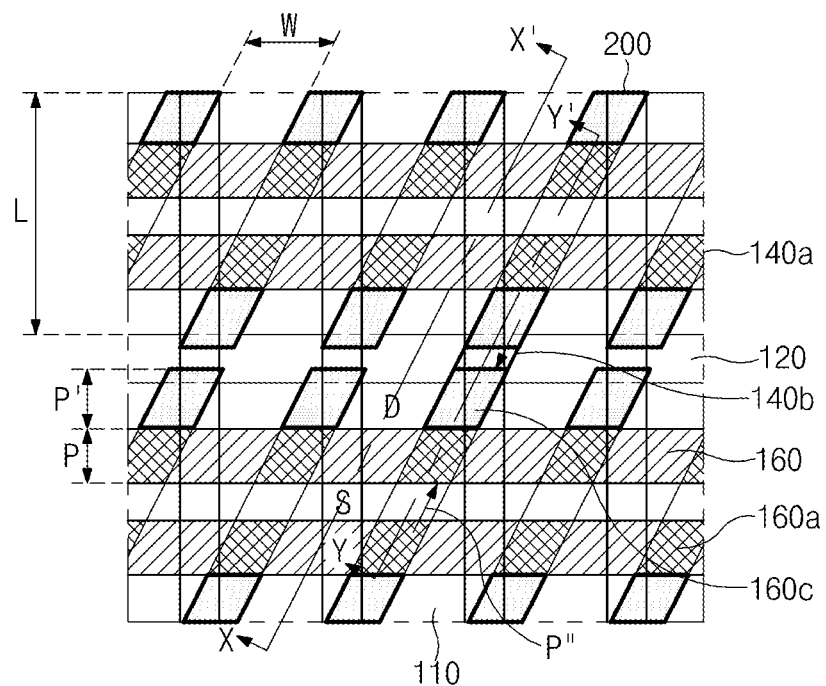
FIG. 1 is a plan view illustrating an electronic device including a buried word line and a method for forming the same according to an embodiment.

FIG. 1 is a plan view illustrating an electronic device including a buried word line and a method for forming the same according to an embodiment.

Referring to FIG. 1, an active region 110, a first device isolation region 120, a buried gate trench 140a, an extended trench 140b, a buried gate 160 of the active region 110, a buried gate 160a of the first device isolation film (or device isolation region) 120, an extended buried gate 160c, and a bit line 200 are formed over a substrate. For more detailed description, the buried gate is classified into a first buried gate (or active gate) 160 in the active region 110 and a second buried gate 160a (or first extended gate) in the first device isolation film 120.

In more detail, after a line-type active region (not shown) is formed over the substrate, some parts of the active region are etched using a line-type etch mask formed to cross a longitudinal direction (i.e., length (L) direction) of the line-type active region, such that the first device isolation film 120 is formed to define the island-type active region 110. In this case, the active region 110 is formed as a 6F2 structure, and may be arranged in a diagonal direction with respect to a Y axis (longitudinal axis: L direction). A width (W) of the active region 110 according to the embodiment may be increased compared to a width of the active region according to the related art, such that patterning can be facilitated when the active region 110 is formed.

Line-type buried gates (160, 160a) arranged in a first direction (crossing the L direction of the active region 110) are formed. In this case, a buried gate formed in the active region 110 may be referred to as a buried gate 160 (or an active gate), and a buried gate extending from the buried gate 160 and formed in the first device isolation film 120 along the first direction may be referred to as a buried gate 160a (or a first extended gate). The buried gates (160, 160a) together may be referred to as a first gate for convenience of description and better understanding of the embodiment.

In addition, an extended buried gate 160c may be coupled to the buried gate 160a of the first device isolation film 120, and the extended buried gate 160c may be additionally formed. The extended buried gate 160c may be referred to as a second gate (or a second extended gate) for convenience of description and better understanding of the embodiment.

In more detail, the second gate 160c may be formed along a second direction (i.e., L direction of the active regions 110) and formed in the first device isolation film 120 between the active regions 110 in a second direction. The second gate 160c may be formed only in one side (or sidewall) of the active region 110 along the second direction.

In an embodiment, although the second gate 160c may be extended to one end of the active region 110 it may be more extended than the one end of the active region 110 so as to reduce resistance. However, it should be noted that the second gates 160c adjacent to each other are formed not to contact each other.

In an active region design shown in FIG. 1, the active region 110 is formed to have a relatively large width (W), and thus a patterning process to form the active region 110 can be easily made. In contrast, each of the buried gates (160, 160a) is formed to have a relatively small width (P), such that resistance of the buried gates (160, 160a) increases. In order to prevent the above-mentioned issue, the structure of the buried gates (160, 160a) may be modified as in the embodiment.

Here, a first width (P) of the buried gate 160 in the active region 110 may be identical to a width (P) of the buried gate 160a in the first device isolation film 120. The second gate 160c is extended in the first device isolation film 120 and has a width (P'). That is, a buried gate formed in the first device isolation film 120 has a width (P'') which is a sum of the first width (P) of the buried gate 160a and the second width (P') of the second gate 160c. The width (P'') obtained by summing up the buried gate 160a and the second gate 160c provided in the first device isolation film 120 increases an effective width of a fin gate, such that gate resistance may be reduced and a gate drive current may be increased.

FIGS. 2A to 2E are cross-sectional views illustrating an electronic device including a buried word line and a method for forming the same according to an embodiment. In each of FIGS. 2A to 2E, (i) is a cross-sectional view illustrating the electronic device taken along the line X-X' of FIG. 1, and (ii) is a cross-sectional view illustrating the electronic device taken along the line Y-Y' of FIG. 1.

Figure 2A:
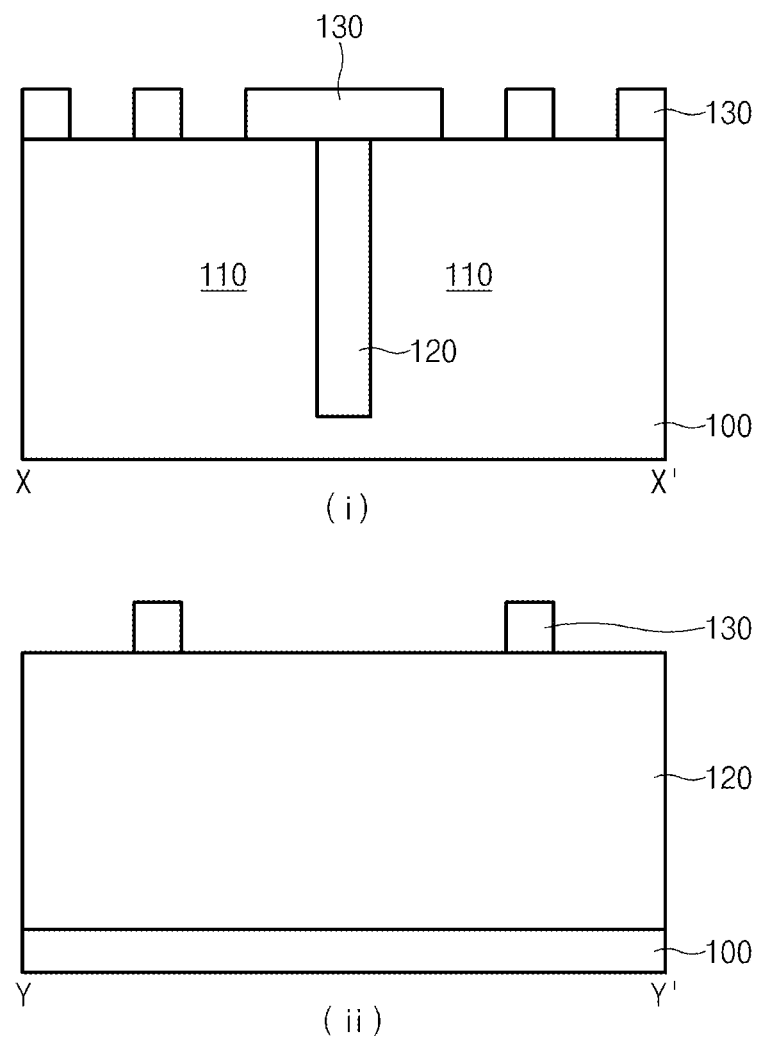
FIGS. 2A to 2E are cross-sectional views illustrating an electronic device including a buried word line and a method for forming the same according to an embodiment.

Referring to FIGS. 2A(i) and 2A(ii), after a photoresist film is formed over the substrate 100, a first photoresist pattern (not shown, a first mask pattern) is formed by an exposure and development process using a mask for formation of a line-type active region.

After that, the substrate 100 is etched using the first photoresist pattern as an etch mask so that the first device isolation film 120 is formed to define a line-type active region.

Thereafter, an island-type active region 110 is formed by etching the line-type active region using a line-type etch mask. Here, the active region 110 may be formed in a 6F2 configuration and is arranged in a diagonal direction with respect to a Y axis. See FIG. 1.

After a photoresist film is formed over the active region 110 and the first device isolation film 120, a second photoresist pattern 130 (i.e., a second mask pattern) is formed by an exposure and development process using a mask for formation of a buried gate. Here, the mask for forming the line-type active region and the mask for forming the buried gate may be implemented as different masks, or may be integrated into a single mask.

Figure 2B:
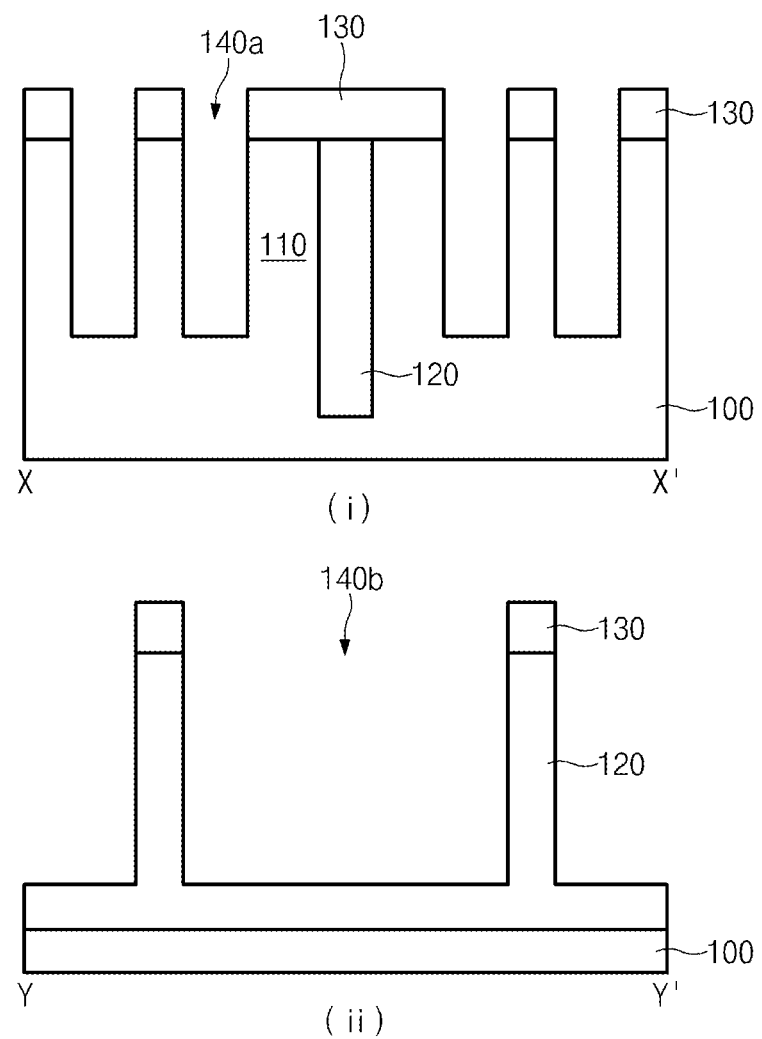

Referring to FIG. 2B(i) and FIG. 2B(ii), the active region 110 and the first device isolation film 120 are etched using the second photoresist pattern 130 as an etch mask, so that trenches (140a, 140b) are formed. In this case, the trench 140a shown in FIG. 2B(i) may be referred to as a buried gate trench, and the other trench 140b shown in FIG. 2B(ii) may be referred to as an extended trench.

For example, the buried gate trench 140a may be extended or elongated in the first direction (crossing the L direction of the active region 110). That is, the buried gate trench 140a may be configured to form a hole by etching the active region 110 and the device isolation film 120 along the first direction, and the extended trench 140b may be configured to form a hole by etching the device isolation film 120 along the second direction (L-direction of the active region 110). In addition, the buried gate trench 140a and the extended trench 140b may be simultaneously formed using the same photoresist pattern, or may be separately formed using a plurality of photoresist patterns.

Figure 2C:
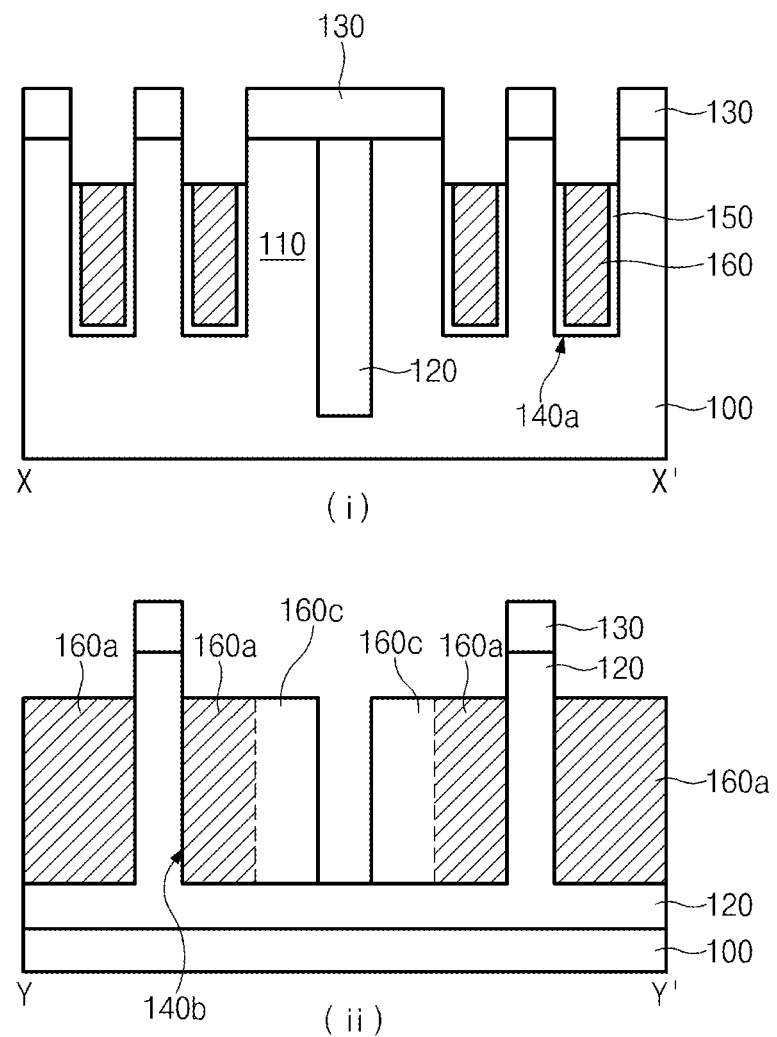

Referring to FIG. 2C(i), a gate insulation film 150 is formed over the buried gate trench 140a. The gate insulation film 150 may be formed by deposition of a gate insulation material, or may be formed by a gate oxidation process. The gate insulation film 150 may include an oxide film.

Thereafter, after a gate metal layer (not shown) is buried in an upper part of the gate insulation film 150, the gate metal layer (not shown) and the gate insulation film 150 are etched back, resulting in formation of the buried gate 160. In this case, the buried gate 160 may be a buried gate contained in the active region 110. The gate metal layer may be formed of any one of titanium (Ti), titanium nitride (TiN), titanium/titanium nitride (Ti/TiN), tungsten nitride (WN), tungsten/tungsten nitride (W/WN), tantalum nitride (TaN), tantalum/tantalum nitride (Ta/TaN), titanium silicon nitride (TiSiN), tantalum nitride silicon (TaSiN), tungsten silicon nitride (WSiN), or may be formed of a combination thereof.

Referring to FIG. 2C(ii), after a buried gate 160a is formed in the extended trench 140b, a extended buried gate 160c which extends from the buried gate 160a to the isolation region 120 is formed between the active regions 110 along the second direction (L direction). The extended buried gate 160c may include titanium (Ti), titanium nitride (TiN) or tungsten (W). In this case, the buried gates (160, 160a) may be referred to as a buried gate 160 of the active region 110 and a buried gate 160a of the first device isolation film 120. The buried gates (160, 160a) together may be referred to as a first gate. The extended buried gate 160c may be referred to as a second gate.

Figure 2D:
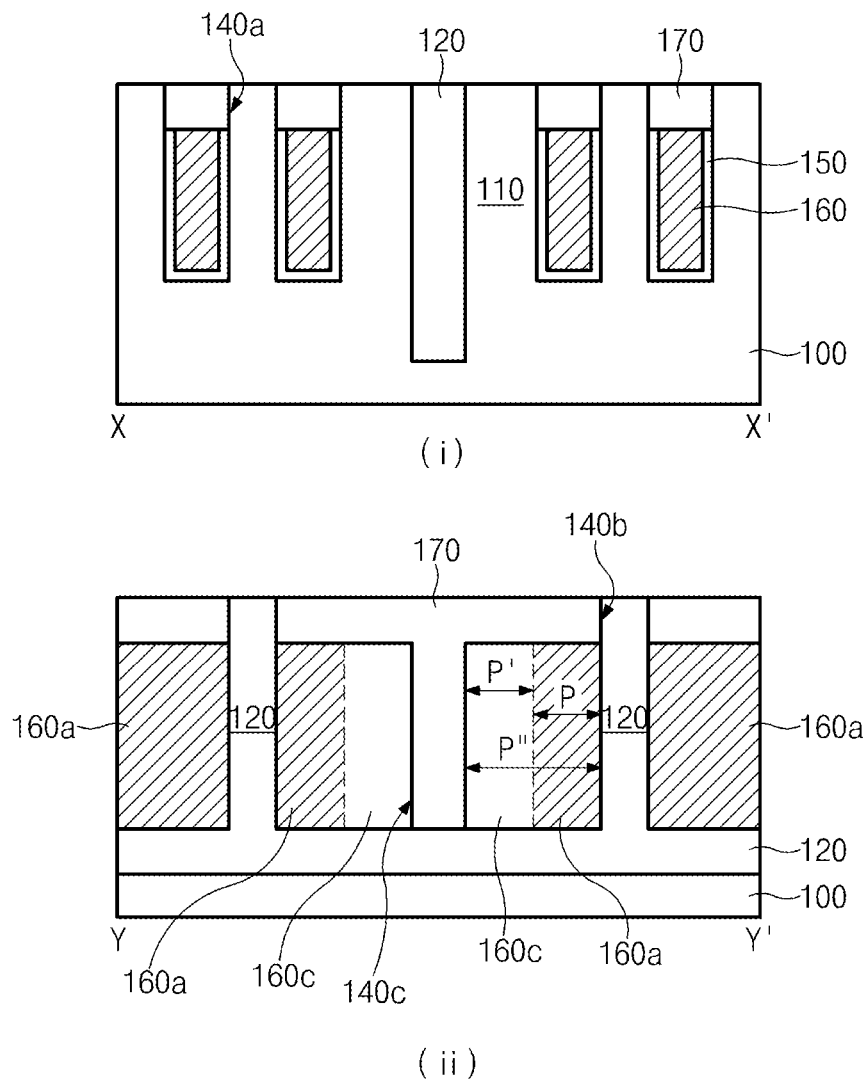

Referring to FIG. 2D(i), an insulation film is formed over the buried gate (160). The insulation film is planarized until the active region 110 and the first device isolation film 120 are exposed, such that the second device isolation film 170 is formed. Here, the insulation film may include a nitride film.

Referring to FIG. 2D(ii), after the insulation film is formed over the buried gate 160a and the extended gate 160c in the trench 140c, the insulation film is planarized until the device isolation film 120 is exposed, such that the second device isolation film 170 is formed. In this case, the second device isolation film 170 may be formed in a T shape, and may be formed to isolate the second gate 160c from each other. In addition, the insulation film may include a nitride film.

Figure 2E:
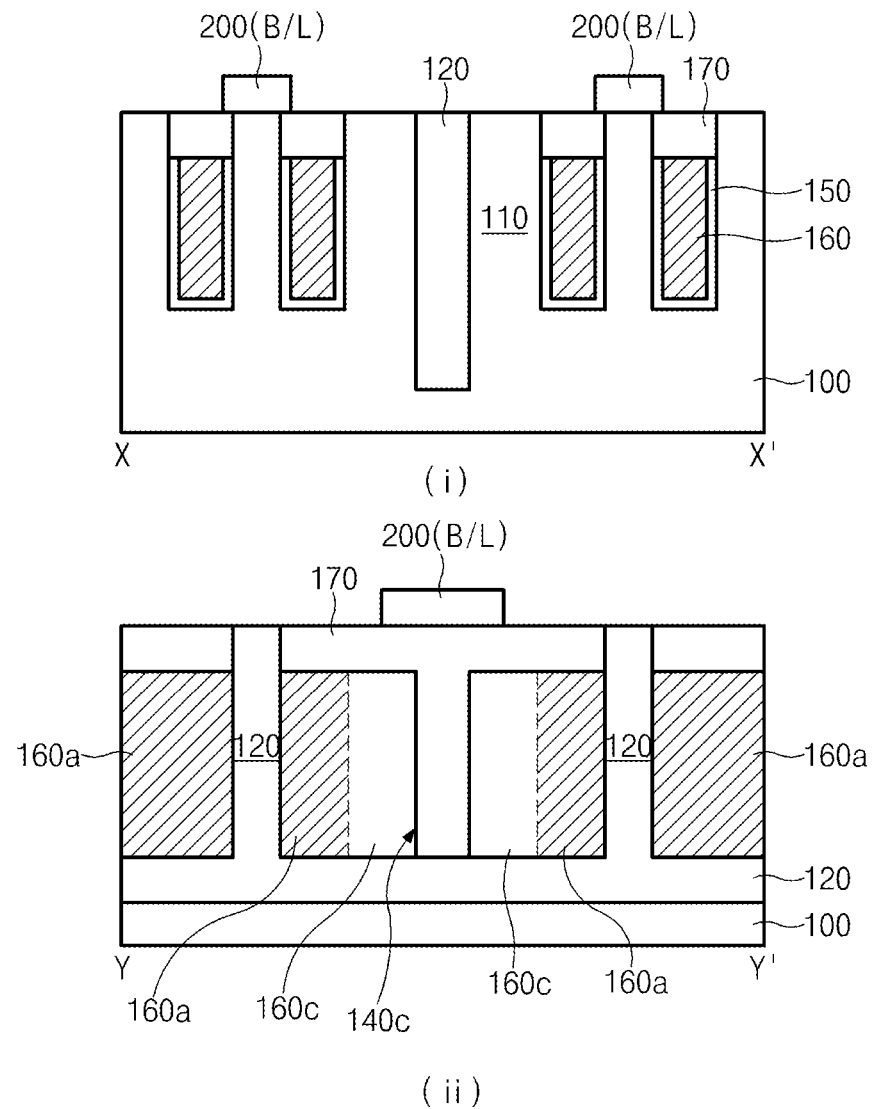

Referring to FIG. 2E(i) and FIG. 2E(ii), a bit line 200 is formed in a direction across the active regions 110, and is formed also across the first gates (160, 160a). In this case, the bit line 200 may be formed as a line structure formed across the first gates (160, 160a) arranged in the first direction.

Figure 3:
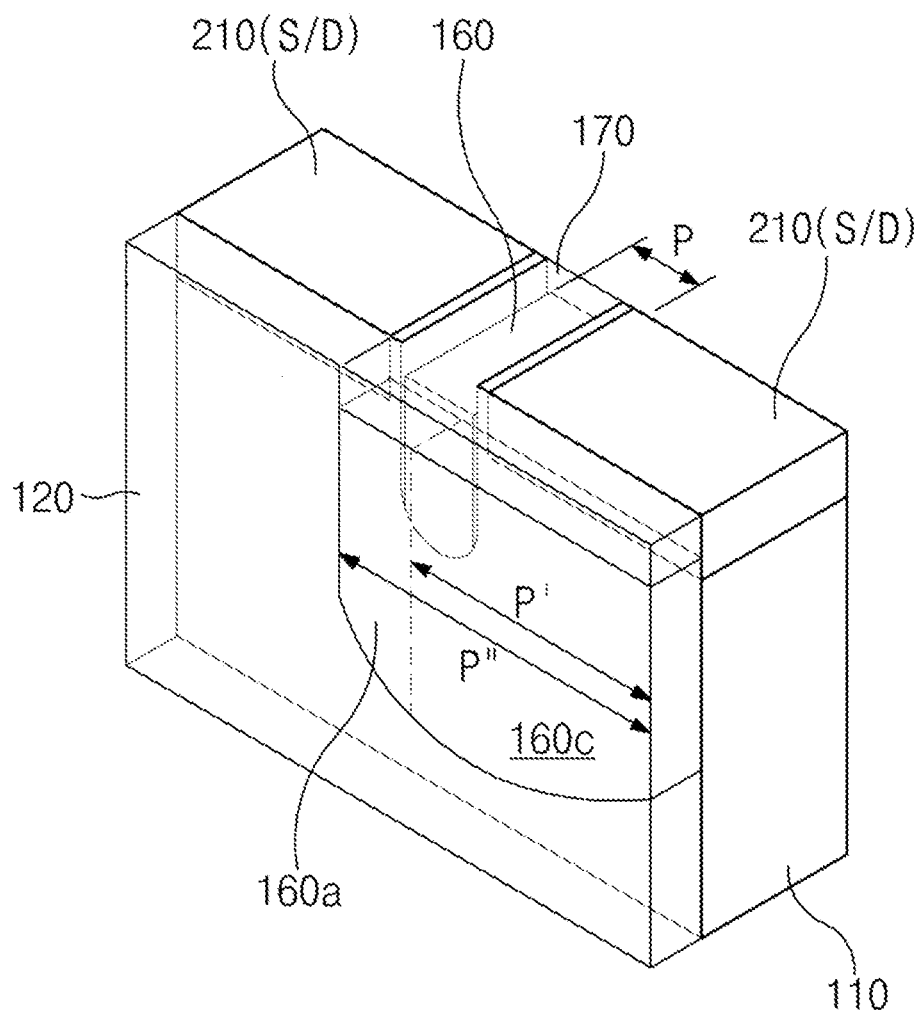
FIG. 3 is a perspective view illustrating an electronic device including a buried word line and a method for forming the same according to an embodiment.

FIG. 3 is a perspective view illustrating an electronic device including a buried word line and a method for forming the same according to an embodiment.

In accordance with the electronic device shown in FIG. 3 and a method for forming the same, a width (P') of the second gate 160c is larger than: (i) a width (P) of the buried gate 160 in the active region 110 which includes a source/drain region 210, or (ii) a width (P) of the buried gate 160a in the first device isolation film 120, such that gate resistance is reduced and a gate drive current increases. In this case, the width (P) of the buried gate 160 in the active region 110 may be identical to the width (P) of the buried gate 160a in the first device isolation film. The second gate 160c may be arranged in the first device isolation film 120 in only one direction.

In addition, when the electronic device employs a buried saddle fin transistor, a word line width increases due to the extended buried gate 160c formed in the first device isolation film, such that word line resistance characteristics can be improved. Specifically, the device isolation film 120 is further etched so that the extended device isolation film 120 can extend from a sidewall of the first gate (160, 160a) to form the fin structure with an enlarged width, resulting in improvement of drive current characteristics of the cell transistor.

Figure 4:
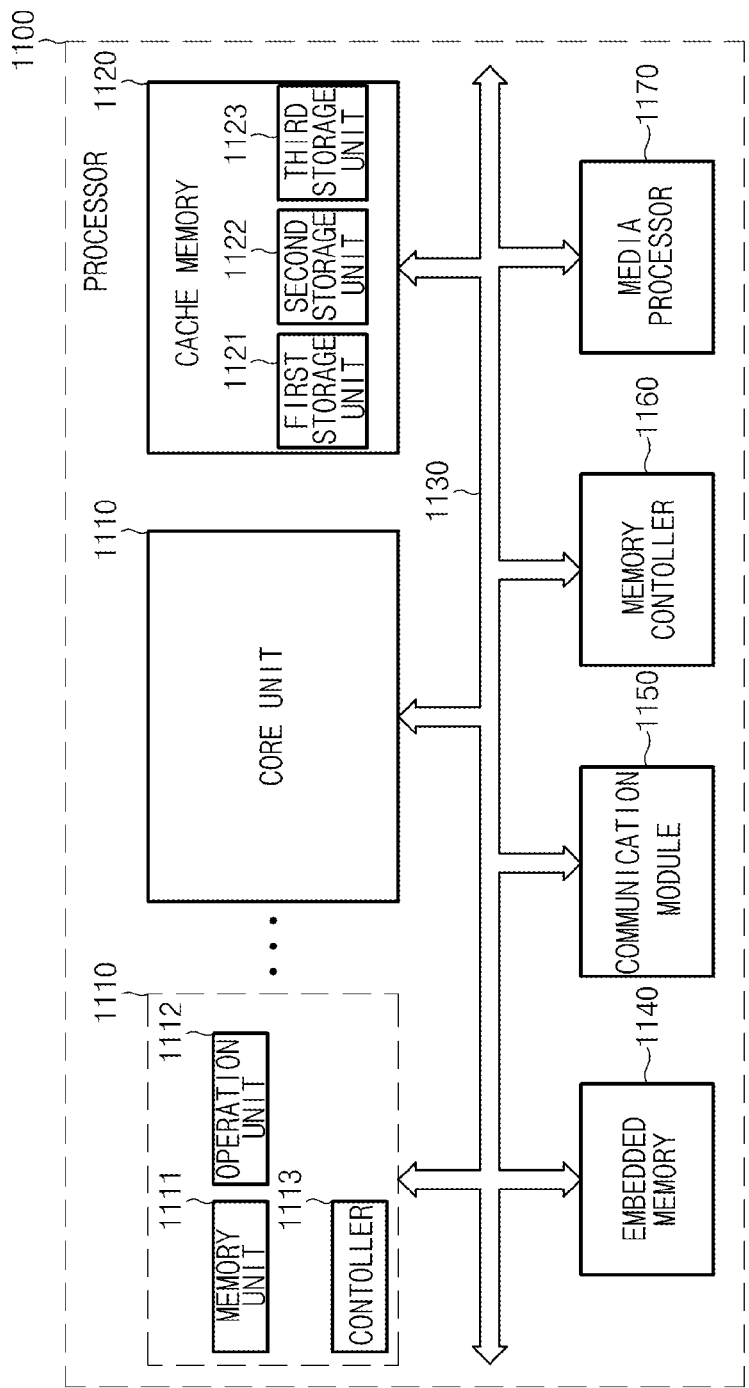
FIG. 4 is a block diagram illustrating a processor according to an embodiment.

FIG. 4 is a block diagram illustrating a processor 1100 according to an embodiment.

Referring to FIG. 4, the processor 1100 may include a microprocessor configured to control and adjust a series of operations for receiving data from various external devices and outputting the processed result to the external devices, and may include a variety of functions, such that throughput improvement and multi-functional characteristics can be implemented. In addition, the processor 1100 may include a core unit 1110, a cache memory unit 1120, and a bus interface 1130. The core unit 1110 according to an embodiment is used as an arithmetic/logic operator of data received from an external device, and may include a memory unit 1111, an operation unit 1112, and a controller 1113. The processor 1110 may be a variety of system on chips (SoCs) such as a Multi Core Processor (MCU), a Graphic Processing Unit (GPU), an Application Processor (AP), etc.

The memory unit 1111 serving as a processor register or a register is contained in the processor 1100 to store data, may include a data register, an address register, and a floating-point register, and may include a variety of registers. The memory unit 1111 may temporarily store either data for calculation of the operation unit 1112 or execution resultant data, and may store an address in which data for execution is stored. The operation unit 1112 is configured to perform internal operation of the processor 1100, and performs various four fundamental arithmetic operations or a logic operation according to a result obtained by command interpretation of the controller 1113. The operation unit 1112 may include one or more Arithmetic and Logic Units (ALUs). The controller 1113 may receive signals from the memory unit 1111, the operation unit 1112, the processor 1100, and other external devices, and may perform various control operations such as command extraction, command analysis, and command input/output, etc. such that processes written by programming can be carried out.

Unlike the core unit 1110 operating at high speed, the cache memory unit 1120 may temporarily store data to offset a difference between data processing speeds of a low-speed external device, and may include a first storage unit 1121, a second storage unit 1122, and a third storage unit 1123. Generally, the cache memory unit 1120 includes the first storage unit 1121 and the second storage unit 1122. If the cache memory unit 1120 needs to have high capacity, it may further include the third storage unit 1123. If necessary, the cache memory unit 1120 may further many more storage units. That is, the number of storage units contained in the cache memory unit 1120 may be differently established according to a variety of designs. In this case, the first, second, and third storage units (1121, 1122, 1123) may have the same or different data storage and/or the same or different processing speeds. If the first to third storage units (1121, 1122, 1123) have different processing speeds, the first storage unit 1121 may have the highest speed. At least one of the first storage unit 1121, the second storage unit 1122, and the third storage unit 1123 of the cache memory unit 1120 may include an embodiment of the above-mentioned electronic device.

Although the first, second, and third storage units (1121, 1122, 1123) are configured in the cache memory unit 1120 as shown in FIG. 4, the first to third storage units (1121, 1122, 1123) of the cache memory unit 1120 may be located outside of the core unit 1110, and it is possible to offset a difference in processing speed between the core unit 1110 and the external device. In addition, the first storage unit 1121 of the cache memory unit 1120 may be located inside of the core unit 1110, and the second and third storage units (1122, 1123) may be located outside of the core unit 1110, such that the function of offsetting the processing speed can be effectively accomplished.

A bus interface 1130 couples the core unit 1110 to the cache memory unit 1120, such that data can be more efficiently transmitted through the bus interface 1130.

The processor 1100 according to the embodiment may include a plurality of core units 1110, and a plurality of core units 1110 may share the cache memory unit 1120. The core units 1110 may be coupled to the cache memory unit 1120 through the bus interface 1130. The plurality of core units may be identical in structure to the above-mentioned core units. If the processor 1100 includes the core units 1110, the first storage unit 1121 of the cache memory unit 1120 may be configured in each core unit 1110 in correspondence to the number of core units 1110, the second storage unit 1122 and the third storage unit 1123 may be integrated into one storage unit, and the integrated storage unit may be located outside of the plurality of core units 1110 and be shared by an external bus interface 1130. Here, the processing speed of the first storage unit 1121 may be higher than that of the second or third storage unit 1122 or 1123.

The processor 1100 according to the embodiment may further include an embedded memory 1140 for storing data; a communication module 1150 for transmitting/receiving data to/from an external device by wire or wirelessly; a memory controller 1160 for driving an external memory device; and a media processor 1170 for processing either data processed by the processor 1100 or input data received from the external input device, and outputting the processed data to the external interface device. Besides the above constituent elements, the processor 1100 may further include a plurality of modules. In this case, the added modules may transmit/receive data to/from the core unit 1110 and the cache memory 1120 through the bus interface 1130. The embedded memory 1140 may include a device isolation film configured to define at least one active region in a substrate, a first gate buried to traverse the active regions and extending to the device isolation film in a first direction, and a second gate coupled to the first gate buried in the device isolation film and extending in a second direction.

As described above, in an embodiment, an active region having a relatively larger width may be provided. An active region with a relatively larger width is easy to be patterned. In addition, a width of a word line in the device isolation film is extended, such that word-line resistance is reduced and a word-line drive current is increased. In addition, a channel width of the active region is increased such that a process margin and semiconductor characteristics can be improved during scale-down processes of a DRAM cell. As a result, operation characteristics of the processor 1100 including the embedded memory 1140 can be improved, resulting in implementation of a high-performance processor 1100.

The embedded memory 1140 may include a non-volatile memory and a volatile memory. The volatile memory may include a Dynamic Random Access Memory (DRAM), a Mobile DRAM, a Static Random Access Memory (SRAM), etc. The non-volatile memory may include a Read Only Memory (ROM), a Nor Flash Memory, a NAND Flash Memory, a Phase Change Random Access Memory (PRAM), a Resistive Random Access Memory (RRAM), a Spin Transfer Torque Random Access Memory (STTRAM), a Magnetic Random Access Memory (MRAM), etc.

The communication module 1150 may include a module coupled to a wired network and a module coupled to a wireless network. The wired network module may include a Local Area Network (LAN), a Universal Serial Bus (USB), an Ethernet, a Power Line Communication (PLC), etc. The wireless network module may include Infrared Data Association (IrDA), Code Division Multiple Access (CDMA), Time Division Multiple Access (TDMA), Frequency Division Multiple Access (FDMA), Wireless LAN (WLAN), Zigbee, Ubiquitous Sensor Network (USN), Bluetooth, Radio Frequency Identification (RFID), Long Term Evolution (LTE), Near Field Communication (NFC), Wireless Broadband Internet (Wibro), High Speed Downlink Packet Access (HSDPA), Wideband CDMA (WCDMA), Ultra WideBand (UWB), etc.

The memory controller 1160 may manage transmission data between the processor 1100 and external storage devices operated according to different communication standards, and may include a variety of memory controllers and a controller. Here, the controller may control Integrated Device Electronics (IDE), Serial Advanced Technology Attachment (SATA), Small Computer System Interface (SCSI), Redundant Array of Independent Disks (RAID), Solid State Disc (SSD), External SATA (eSATA), Personal Computer Memory Card International Association (PCMCIA), Universal Serial Bus (USB), Secure Digital (SD), mini Secure Digital card (mSD), micro SD, Secure Digital High Capacity (SDHC), Memory Stick Card, Smart Media Card (SM), Multi Media Card (MMC), Embedded MMC (eMMC), Compact Flash (CF), etc.

The media processor 1170 may include a Graphics Processing Unit (GPU), a Digital Signal Processor (DSP), a High Definition Audio (HD Audio), a High Definition Multimedia Interface (HDMI) controller, etc., which are configured to fabricate data processed by the processor 1100 and input data received from an external input device in such a manner that the fabricated data is configured in the form of audio, video, and other data and transferred to the external interface device.

Figure 5:
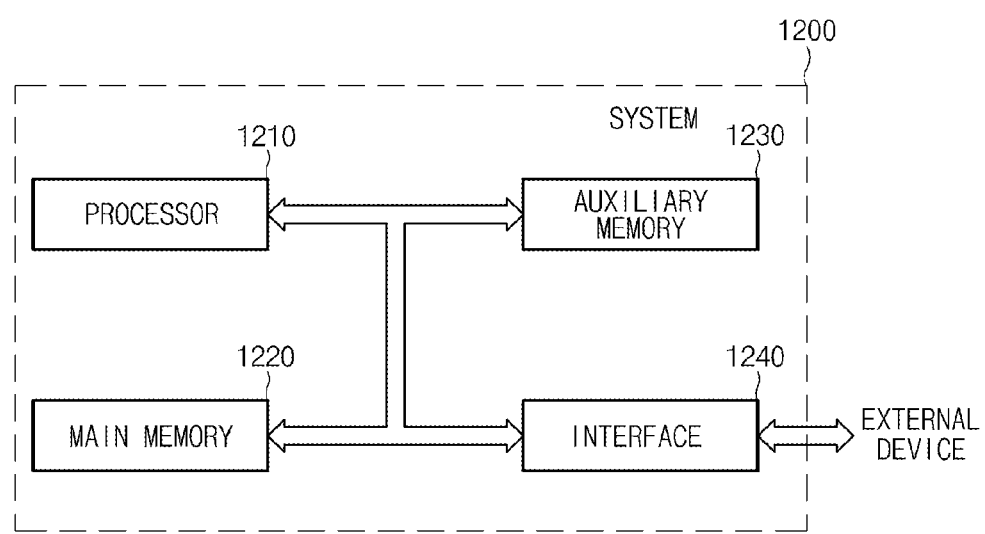
FIG. 5 is a block diagram illustrating a system according to an embodiment.

FIG. 5 is a block diagram illustrating a system 1200 according to an embodiment.

Referring to FIG. 5, the system 1200 serving as a data processor may perform a variety of operations such as input, processing, output, communication, and storing actions, and may include a processor 1210, a main memory unit 1220, an auxiliary memory unit 1230, and an interface unit 1240. The system according to the embodiment may be any one of a variety of electronic systems operated by a variety of processes, for example, a computer, a server, a Personal Digital Assistant (PDA), a Portable Computer, a Web Tablet, a Wireless Phone, a mobile phone, a smart phone, a digital music player, Portable Multimedia Player (PMP), a camera, a Global Positioning System (GPS), a video camera, a voice recorder, a Telematics, an Audio Visual (AV) System, a Smart Television, etc.

The processor 1210 is the most important element for interpreting an input command, and controlling various processes such as calculation, comparison, etc. of data stored in the system. For example, the processor 1210 may be comprised of a Micro Processor Unit (MPU), a Central Processing Unit (CPU), a Single/Multi Core Processor, a Graphic Processing Unit (GPU), an Application Processor (AP), a Digital Signal Processor (DSP), etc.

The main memory unit 1220 is a memory for shifting a program or data stored in the auxiliary memory unit 1230 during the program execution time, and may include the electronic device according to the above-mentioned embodiment. The main memory unit 1220 may include a device isolation film configured to define active regions in the substrate, a first gate buried to traverse the active regions and the device isolation film in a first direction, and a second gate coupled to the first gate buried in the device isolation film and extended in a second direction.

As described above, in an embodiment, an active region with a relatively larger width can be formed, providing a larger process margin in patterning. A width of a word line in the device isolation film is further extended, such that word-line resistance is reduced and a word-line drive current is increased. In addition, a channel width of the active region is increased such that a process margin and semiconductor characteristics can be improved during a scale-down process for a DRAM cell. As a result, operation characteristics of the system 1200 including the main memory unit 1220 can be improved, resulting in implementation of a high-performance system 1200.

In addition, the main memory unit 1220 may include a Static Random Access Memory (SRAM) and a Dynamic Random Access Memory (DRAM), etc. such as a volatile memory data of which is deleted when the main memory 1220 is powered off.

The auxiliary memory unit 1230 is a memory device for storing a program code or data. The auxiliary memory unit 1230 may store a large amount of information or data whereas it operates at a lower speed than the main memory unit 1220. The auxiliary memory unit 1230 may further include data storage systems, for example, a magnetic tape using a magnetic field, a magnetic disc, a laser disc using light, a magneto-optical disc using the magnetic disc and the laser disc, a Solid State Disc (SSD), a Universal Serial Bus (USB) memory, a Secure Digital (SD), a mini Secure Digital (mSD) card, a micro SD, a high-capacity Secure Digital High Capacity (SDHC), a memory stick card (MSC), a Smart Media (SM) card, a Multi Media Card (MMC), an Embedded MMC (eMMC), a Compact Flash (CF) card, etc.

The interface unit 1240 may be configured to exchange command and data between the system of this embodiment and an external device, and may be any of a keypad, a keyboard, a mouse, a speaker, a microphone, a display, a variety of Human Interface Devices (HIDs), a communication device, etc. The communication device may include a module coupled to a wired network and a module coupled to a wireless network. The wired network module may include a Local Area Network (LAN), a Universal Serial Bus (USB), an Ethernet, a Power Line Communication (PLC), etc. The wireless network module may include an Infrared Data Association (IrDA), a Code Division Multiple Access (CDMA), a Time Division Multiple Access (TDMA), a Frequency Division Multiple Access (FDMA), a Wireless LAN, a Zigbee, a Ubiquitous Sensor Network (USN), a Bluetooth, a Radio Frequency Identification (RFID), a Long Term Evolution (LTE), a Near Field Communication (NFC), a Wireless Broadband Internet (Wibro), a High Speed Downlink Packet Access (HSDPA), a Wideband CDMA (WCDMA), a Ultra WideBand (UWB), etc.

Figure 6:
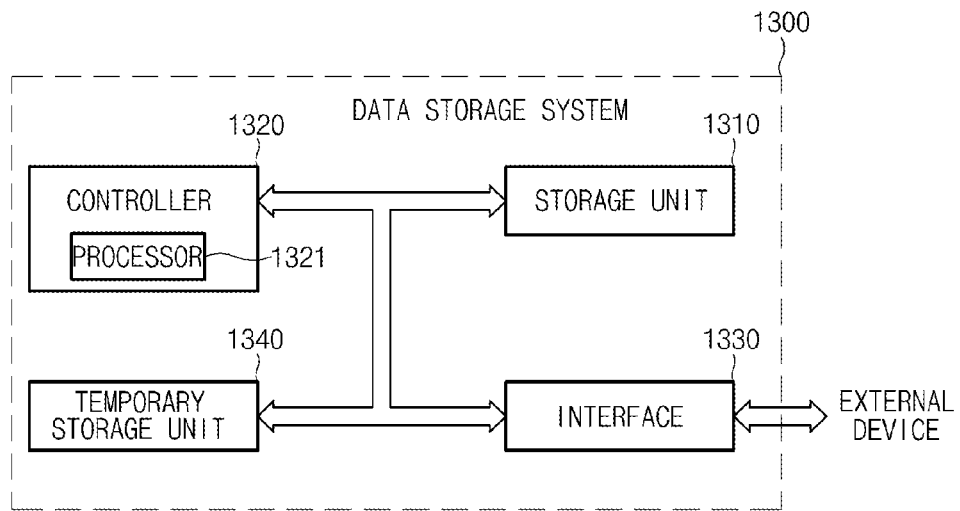
FIG. 6 is a block diagram illustrating a data storage system according to an embodiment.

FIG. 6 is a block diagram illustrating a data storage system 1300 according to an embodiment.

Referring to FIG. 6, the data storage system 1300 may include a non-volatile storage unit 1310 for storing data, a controller 1320 for controlling the non-volatile storage unit 1310, and an interface 1330 coupled to an external device. The data storage system 1300 may be configured in the form of a disc, for example, a Hard Disk Drive (HDD), a Compact Disc Read Only Memory (CDROM), a Digital Versatile Disc (DVD), a Solid State Disc (SSD), and may also be configured in the form of a card, for example, a Universal Serial Bus (USB) memory, a Secure Digital (SD), a mini Secure Digital (mSD) card, a micro SD card, a high-capacity Secure Digital High Capacity (SDHC), a Memory Stick Card, a Smart Media (SM) card, a Multi Media Card (MMC), an Embedded MMC (eMMC), a Compact Flash (CF) card, etc.

The controller 1320 may control data exchange between the storage unit 1310 and the interface 1330. For this purpose, the controller 1320 may include a processor configured to calculate/process commands received through the interface 1330 from an external part of the data storage system 1300.

The interface 1330 may exchange commands and data between the data storage system 1300 and the external device. If the data storage system 1300 is configured in the form of a card, the data storage system 1300 may be used as an interface that is compatible with a Universal Serial Bus (USB) memory, a Secure Digital (SD) card, a mini Secure Digital (mSD) card, a micro SD card, a high-capacity Secure Digital High Capacity (SDHC), a memory stick card, a Smart Media (SM) card, a Multi Media Card (MMC), an Embedded MMC (eMMC), and a Compact Flash (CF) card. If the data storage system 1300 is configured in the form of a disc, the data storage system 1300 may be used as an interface that is compatible with an Integrated Device Electronics (IDE), a Serial Advanced Technology Attachment (SATA), a Small Computer System Interface (SCSI), External SATA (eSATA), a Personal Computer Memory Card International Association (PCMCIA), and a Universal Serial Bus (USB).

As an interface for an external device, a controller, and a system are gradually diversified and manufactured to have higher performance, the data storage system 1300 according to the embodiment may further include a temporary storage unit 1340 configured to efficiently perform data communication between the interface 1330 and the storage unit 1310. The temporary storage unit 1340 may include the above-mentioned electronic device. The storage unit 1310 may include a device isolation film configured to define an active region in a substrate, a first gate buried to traverse the active regions and the device isolation film in a first direction, and a second gate coupled to the first gate buried in the device isolation film and extended in a second direction.

As described above, a width of an active region is increased to facilitate patterning, and a width of a word line in the device isolation film is extended, such that word-line resistance is reduced and a word-line drive current is increased. In addition, a channel width of the active region is increased such that a process margin and semiconductor characteristics can be improved during the scale-down process of a DRAM cell. As a result, operation characteristics of the data storage system 1300 including the temporary storage unit 1340 can be improved, resulting in implementation of a high-performance data storage system 1300.

Figure 7:
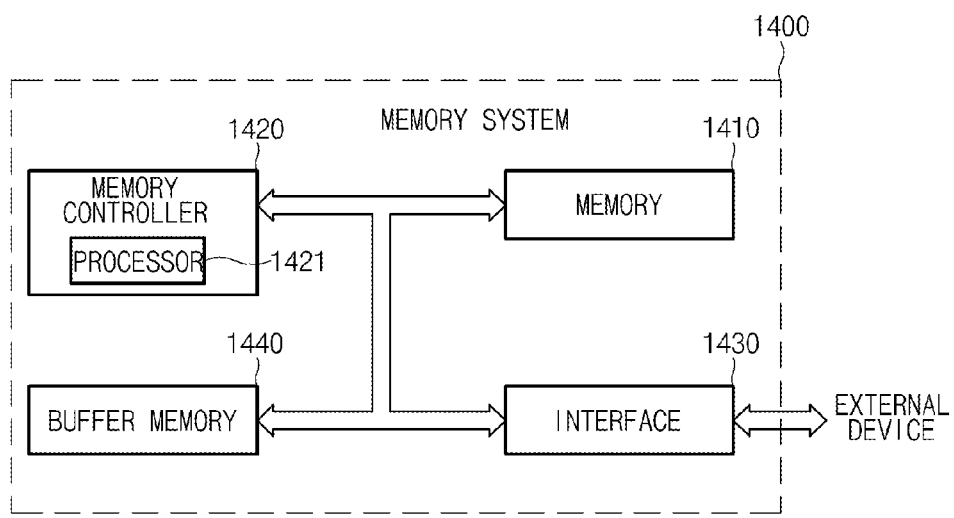
FIG. 7 is a block diagram illustrating a memory system according to an embodiment.

FIG. 7 is a block diagram illustrating a memory system 1400 according to an embodiment.

Referring to FIG. 7, the memory system 1400 may include a non-volatile memory 1410 for storing data, a memory controller 1420 for controlling the non-volatile memory 1410, and an interface 1430 coupled to the external device. The memory system 1400 may be configured in the form of a card, for example, a Solid State Disc (SSD), a Universal Serial Bus (USB) memory, a Secure Digital (SD) card, a mini Secure Digital (mSD) card, a micro SD card, a Secure Digital High Capacity (SDHC), a memory stick card, a Smart Media (SM) card, a Multi Media Card (MMC), an embedded MMC (eMMC), a Compact Flash (CF) card, etc.

In addition, the memory according to the embodiment may further include a non-volatile memory, for example, a Read Only Memory (ROM), a Nor Flash Memory, a NAND Flash Memory, a Phase Change Random Access Memory (PRAM), a Resistive Random Access Memory (RRAM), a Magnetic Random Access Memory (MRAM), etc. The memory controller 1420 may control data communication between the memory 1410 and the interface 1430. For this purpose, the memory controller 1420 may include a processor configured to calculate/process commands received through the interface 1430 from an external part of the memory system 1400.

The interface 1430 may exchange commands and data between the memory system 1400 and the external device, and may be compatible with a Universal Serial Bus (USB) memory, a Secure Digital (SD) card, a mini Secure Digital (mSD) card, a micro SD card, a high-capacity Secure Digital High Capacity (SDHC), a memory stick card, a Smart Media (SM) card, a Multi Media Card (MMC), an Embedded MMC (eMMC), and a Compact Flash (CF) card.

As an interface for an external device, a memory controller, and a memory system are gradually diversified and manufactured to have higher performance, the memory system 1400 according to the embodiment may further include a buffer memory 1440 configured to efficiently perform the data input/output (I/O) operation between the interface 1430 and the memory 1410. The buffer memory 1440 for temporarily storing data may include the above-mentioned electronic device. The buffer memory 1440 may include a device isolation film configured to define an active region in a substrate, a first gate buried to traverse the active regions and the device isolation film in a first direction, and a second gate coupled to the first gate buried in the device isolation film and extended in a second direction.

As described above, a width of an active region is increased to facilitate patterning, and a width of a word line in the device isolation film is extended, such that word-line resistance is reduced and a word-line drive current is increased. In addition, a channel width of the active region is increased such that a process margin and semiconductor characteristics can be improved during a scale-down process for a DRAM cell. As a result, operation characteristics of the memory system 1400 including the buffer memory 1440 can be improved, resulting in a high-performance memory system 1400.

In addition, the buffer memory 1440 according to the embodiment may further include a volatile Static Random Access Memory (SRAM), a Dynamic Random Access Memory (DRAM), a non-volatile Phase Change Random Access Memory (PRAM), a Resistive Random Access Memory (RRAM), a Spin Transfer Torque Random Access Memory (STTRAM), a Magnetic Random Access Memory (MRAM), etc.

The above exemplary embodiments are to be construed in all aspects as illustrative and not restrictive.

Embodiments are illustrative and not limitative. Various alternatives and modifications are possible. Embodiments are not limited by the type of deposition, etching polishing, and patterning steps described herein. Nor are the embodiments limited to any specific type of electronic device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. An electronic device comprising:
   a device isolation film defining an active region in a substrate;
   a first gate that traverses the active region and extends in a first direction, the first gate including a first portion and a second portion, the first portion buried in the active region, the second portion buried in the device isolation film; and
   a second gate coupled to the second portion of the first gate buried in the device isolation film and extending in a second direction that crosses the first direction,
   wherein the second gate is disposed at one side of the second portion of the first gate in the second direction.

2. The electronic device according to claim 1, wherein the active region extends in the second direction, and
   wherein the second gate extends along a length of a portion of a sidewall of the active region including an end of the sidewall of the active region.

3. The electronic device according to claim 1, wherein the active region extends in the second direction, and
   wherein the second gate extends along a length of a portion of a sidewall of the active region including an end of the sidewall of the active region and extends beyond the end of the active region.

4. The electronic device according to claim 1, further comprising:
   an insulation film disposed over the first gate and the second gate.

5. The electronic device according to claim 1, further comprising:
   a bit line extending in a third direction to cross the first gate.

6. The electronic device according to claim 1, further comprising:
   a source/drain region disposed over the active region.

7. The electronic device according to claim 1, wherein the active region has a 6F2 configuration.

8. The electronic device according to claim 1, wherein a longitudinal axis of the active region is arranged in the second direction crossing the first direction.

9. The Electronic device according to claim 1, further comprising a processor which includes:
   a core unit configured to perform, in response to an external command, an operation corresponding to the external command, by using data;
   a cache memory unit configured to store data for executing the operation, data corresponding to a result of the operation execution, and/or an address of the operation execution data;

a bus interface coupled between the core unit and the cache memory, and configured to communicate between the core unit and the cache memory;

an embedded memory unit;

a communication module unit configured to transmit/receive data to/from an external device by wire or wirelessly;

a memory controller configured to drive an external memory device; and a media processor configured to fabricate either data processed by a processor and/or data received from an external input device, and configured to output the fabricated data to an external interface device, wherein the embedded memory unit includes:

a device isolation film configured to define an active region in a substrate, a first gate buried to traverse the active region and formed in the device isolation film in a first direction, and a second gate coupled to the first gate buried in the device isolation film, and extended in a second direction.

10. The Electronic device according to claim 1, further comprising a system which includes:

a processor configured to interpret an external input command, and control an operation of information according to a result of the command interpretation;

an auxiliary memory unit configured to store a program needed for the command interpretation and the information;

a main memory unit configured to shift/store the program and the information from the auxiliary memory unit in such a manner that the processor performs the operation using the program and the information during execution of the program; and an interface configured to perform communication between an external device and at least one of the processor, the auxiliary memory unit, and the main memory unit, wherein the main memory unit includes:

a device isolation film formed to define an active region in a substrate;

a first gate buried to traverse the active region and formed in the device isolation film in a first direction; and a second gate coupled to the first gate buried in the device isolation film, and extending in a second direction.

11. The Electronic device according to claim 1, further comprising a data storage system which includes:

a storage unit configured to store data and maintain the stored data irrespective of the presence or absence of power source;

a controller configured to control data input/output (I/O) of the storage unit in response to an external input command;

a temporary storage unit configured to temporarily store data exchanged between the storage unit and an external part; and an interface configured to perform communication between an external part and at least one of the storage unit, the controller, and the temporary storage unit, wherein the temporary storage unit includes a device isolation film formed to define an active region in a substrate;

a first gate buried to traverse the active region and formed in the device isolation film in a first direction; and a second gate coupled to the first gate buried in the device isolation film and extending in a second direction.

12. The Electronic device according to claim 1, further comprising a memory system which includes:

a memory configured to store data and maintain the stored data irrespective of the presence or absence of power source;

a memory controller configured to control data input/output (I/O) of the storage unit in response to an external input command;

a buffer memory configured to perform buffering of data exchanged between the storage unit and an external part; and an interface configured to perform communication between an external part and at least one of the storage unit, the memory controller, and the buffer memory, wherein the buffer memory includes a device isolation film formed to define an active region in a substrate;

a first gate buried to traverse the active region and formed in the device isolation film in a first direction; and a second gate coupled to the first gate buried in the device isolation film and extending in a second direction.

13. The electronic device according to claim 1, wherein the second gate is electrically coupled to the second portion of the first gate.

14. The electronic device according to claim 1, wherein the first direction is oblique to the second direction.

15. The electronic device according to claim 1, further comprising:

a third gate that traverses the active region and extends in the first direction, the third gate including a first portion and a second portion; and a fourth gate extending from the second portion of the third gate in an opposite direction to the second direction of the second gate.

16. An electronic device comprising:

a substrate including a device isolation region and an active region;

an active gate disposed in the active region and extending in a first direction;

a first extended gate extending from the active gate in the first direction into the device isolation region; and a second extended gate extending from the first extended gate in a second direction along a sidewall of the active region, the second direction crossing the first direction, wherein the second extended gate is disposed at one side of the first extended gate in the second direction.

17. The electronic device of claim 16, further comprising a source/drain region disposed over the active region, wherein the second extended gate is disposed over a portion of the sidewall of the active region over which the source/drain region is disposed.

18. An electronic device comprising a semiconductor memory unit that includes:

a device isolation film defining an active region in a substrate;

a first gate that traverses the active region and extends in a first direction, the first gate including a first portion and a second portion, the first portion buried in the active region, the second portion buried in the device isolation film; and a second gate coupled to the second portion of the first gate buried in the device isolation film and extending in a second direction, wherein the second gate is disposed at one side of the second portion of the first gate in the second direction.

19. The electronic device according to claim 18, wherein the second gate is electrically coupled to the second portion of the first gate.

20. The electronic device according to claim 18, wherein a length of the first portion of the first gate in the second direction is substantially the same as a length of the second portion of the first gate in the second direction.

* * * * *